United States Patent
Chandra et al.

(10) Patent No.: US 10,097,195 B2
(45) Date of Patent: Oct. 9, 2018

(54) DIGITAL-TO-ANALOG CONVERTER (DAC) WITH ENHANCED DYNAMIC ELEMENT MATCHING (DEM) AND CALIBRATION

(71) Applicant: MaxLinear, Inc., Carlsbad, CA (US)

(72) Inventors: Gaurav Chandra, Carlsbad, CA (US); Tao Zeng, Carlsbad, CA (US); Shantha Murthy Prem Swaroop, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/700,383

(22) Filed: Sep. 11, 2017

(65) Prior Publication Data

US 2018/0097524 A1 Apr. 5, 2018

Related U.S. Application Data

(63) Continuation of application No. 15/130,617, filed on Apr. 15, 2016, now Pat. No. 9,762,256.

(60) Provisional application No. 62/148,517, filed on Apr. 16, 2015, provisional application No. 62/148,490, filed on Apr. 16, 2015.

(51) Int. Cl.
*H03M 1/48* (2006.01)
*H03M 1/06* (2006.01)
*H03M 1/10* (2006.01)
*H03M 1/66* (2006.01)

(52) U.S. Cl.
CPC ......... *H03M 1/066* (2013.01); *H03M 1/1038* (2013.01); *H03M 1/66* (2013.01)

(58) Field of Classification Search
CPC .. H03M 1/066; H03M 1/1038; H03M 1/1023; H03M 1/0607; H03M 1/1014; H03M 1/68
USPC .......................................................... 341/118
See application file for complete search history.

(56) References Cited

U.S. PATENT DOCUMENTS

| | | | | |
|---|---|---|---|---|
| 4,490,714 A | * | 12/1984 | van de Plassche | H03M 1/0607 341/118 |
| 6,672,869 B2 | * | 1/2004 | Rabenstein | A61C 9/002 433/74 |
| 6,734,818 B2 | * | 5/2004 | Galton | H03M 1/0673 341/118 |
| 7,378,998 B2 | * | 5/2008 | Rudberg | H03M 1/1052 341/118 |
| 9,543,974 B1 | * | 1/2017 | Yang | H03M 1/066 |
| 9,762,256 B2 | * | 9/2017 | Chandra | H03M 1/066 |

(Continued)

*Primary Examiner* — Lam T Mai
(74) *Attorney, Agent, or Firm* — McAndrews, Held & Malloy, Ltd.

(57) ABSTRACT

Systems and methods are provided for digital-to-analog converters (DACs) with enhanced dynamic element matching (DEM) and calibration. DEM may be adapted based on assessment of one or more conditions that may affect the DACs or DEM functions thereof. The one or more condition may comprise amount of signal backoff. The adaption may comprise switching the DEM function (as a whole, or partially—e.g., individual DEM elements) on or off based on the assess conditions. The DACs may incorporate use of calibration. The DEM and/or the calibration may be applied to only a portion of the DAC, such as a particular segment (e.g., a middle segment comprising bits between the MSBs and the LSBs).

8 Claims, 6 Drawing Sheets

(56) References Cited

U.S. PATENT DOCUMENTS

| | | | |
|---|---|---|---|
| 2006/0007029 A1* | 1/2006 | Ito | H03M 1/0607 341/144 |
| 2010/0245142 A1* | 9/2010 | Myles | H03M 1/0665 341/133 |
| 2012/0212357 A1* | 8/2012 | Haneda | H03M 1/066 341/110 |

* cited by examiner

DIGITAL-TO-ANALOG CONVERTER (DAC) WITH ENHANCED DYNAMIC ELEMENT MATCHING (DEM) AND CALIBRATION

CLAIM OF PRIORITY AND CROSS-REFERENCE TO RELATED APPLICATIONS

This patent application is a continuation of U.S. Provisional patent application Ser. No. 15/130,617, filed on Apr. 15, 2016, which in turn makes reference to, claims priority to and claims benefit from each of U.S. Provisional Patent Application Ser. No. 62/148,490, filed on Apr. 16, 2015, and U.S. Provisional Patent Application Ser. No. 62/148,517, filed on Apr. 16, 2015.

Each of the above identified applications is hereby incorporated herein by reference in its entirety.

This patent application also makes reference to: U.S. patent application Ser. No. 15/130,636, filed on Apr. 15, 2017; and U.S. patent application Ser. No. 15/130,602, filed on Apr. 15, 2017.

Each of the above identified applications is hereby incorporated herein by reference in its entirety.

TECHNICAL FIELD

Aspects of the present disclosure relate to signal processing. More specifically, various implementations of the present disclosure relate to digital-to-analog converters (DACs) with enhanced dynamic element matching (DEM) and calibration.

BACKGROUND

Conventional approaches for performing digital-to-analog conversions may be costly, cumbersome, or inefficient—e.g., they may be complex and/or time consuming, require considerable power, and/or may introduce errors or distortion. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for digital-to-analog converters (DACs) with enhanced dynamic element matching (DEM) and calibration, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (e.g., hardware), and any software and/or firmware ("code") that may configure the hardware, be executed by the hardware, and or otherwise be associated with the hardware. As used herein, for example, a particular processor and memory (e.g., a volatile or non-volatile memory device, a general computer-readable medium, etc.) may comprise a first "circuit" when executing a first one or more lines of code and may comprise a second "circuit" when executing a second one or more lines of code. Additionally, a circuit may comprise analog and/or digital circuitry. Such circuitry may, for example, operate on analog and/or digital signals. It should be understood that a circuit may be in a single device or chip, on a single motherboard, in a single chassis, in a plurality of enclosures at a single geographical location, in a plurality of enclosures distributed over a plurality of geographical locations, etc. Similarly, the term "module" may, for example, refer to a physical electronic components (e.g., hardware) and any software and/or firmware ("code") that may configure the hardware, be executed by the hardware, and or otherwise be associated with the hardware.

As utilized herein, circuitry or module is "operable" to perform a function whenever the circuitry or module comprises the necessary hardware and code (if any is necessary) to perform the function, regardless of whether performance of the function is disabled or not enabled (e.g., by a user-configurable setting, factory trim, etc.).

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g." set off lists of one or more non-limiting examples, instances, or illustrations.

Figure 1:
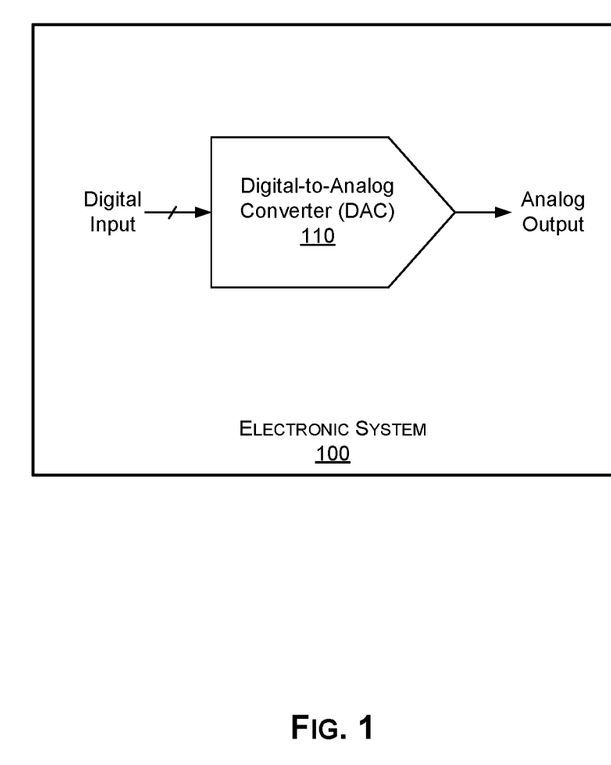
FIG. 1 illustrates an example electronic system that may be operable to perform digital-to-analog conversions.

FIG. 1 illustrates an example electronic system that may be operable to perform digital-to-analog conversions. Shown in FIG. 1 is an electronic system 100.

The electronic system 100 may comprise suitable circuitry for implementing various aspects of the present disclosure. The electronic system 100 may be configured to support performing, executing or running various operations, functions, applications and/or services. The electronic system 100 may be used, for example, in executing computer programs, playing video and/or audio content, gaming, performing communication applications or services (e.g., Internet access and/or browsing, email, text messaging, chatting and/or voice calling services), providing networking services (e.g., WiFi hotspot, Bluetooth piconet, Ethernet networking, cable or satellite systems, and/or active 4G/3G/ femtocell data channels), or the like.

In some instances, the electronic system 100 may enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted and/or received signals in accordance with applicable wired or wireless protocols.

Examples of wireless standards, protocols, and/or interfaces that may be supported and/or used by the electronic system 100 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), and/or the like.

Examples of wired standards, protocols, and/or interfaces that may be supported and/or used by the electronic system 100 may comprise Ethernet (IEEE 802.3), Fiber Distributed Data Interface (FDDI), Integrated Services Digital Network (ISDN), cable television and/or internet access standards (e.g., ATSC, DVB-C, DOCSIS, etc.), in-home distribution standards such as Multimedia over Coax Alliance (MoCA), and Universal Serial Bus (USB) based interfaces.

Examples of signal processing operations that may be performed by the electronic system 100 may comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to support input/output (I/O) operations, to enable receiving input from and/or providing output to users. Accordingly, the electronic system 100 may comprise components or subsystems for obtaining user input and/or providing output to the user. For example, the electronic system 100 may support input/output (I/O) operations for allowing user interactions which may be needed for controlling the electronic system 100 or operations thereof—e.g., allowing users to provide input or commands, for controlling certain functions or components of the electronic system 100, and/or to output or provide feedback pertaining to functions or components. The electronic system 100 may also support input/output (I/O) operations in conjunction with use of data (e.g., multimedia content). For example, the electronic system 100 may support generating, processing, and/or outputting of video and/or acoustic signals, such as via suitable output devices or components (e.g., displays, loudspeakers, etc.). In this regard, the output signals may be generated based on content, which may be in digital form (e.g., digitally formatted music or the like). Similarly, the electronic system 100 may support capturing and processing of video and/or acoustic signals, such as via suitable input devices or components (e.g., cameras, microphones, etc.), to generate (e.g., to store or communicate) corresponding data. The corresponding data may be in digital form (e.g., digitally formatted music, video, or the like).

The electronic system 100 may be a stationary system (e.g., being installed at, and/or configured for use only in particular location). In other instances, however, the electronic system 100 may be a mobile device—i.e. intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), computers (e.g., laptops, desktops, or servers), dedicated media devices (e.g., televisions, game consoles, or portable media players, etc.), set-top boxes (STBs) or other similar receiver systems, and the like. The disclosure, however, is not limited to any particular type of electronic system.

In operation, the electronic system 100 may be operable to perform various operations, functions, applications and/or services. For example, in some instances, electronic system 100 may be operable to communicate (send and/or receive) data, and to process the communicated data. In this regard, communication of data, whether over wired or wireless interfaces, may typically comprise transmitting and/or receiving signals that are communicated over wireless and/or wired connections. For example, analog radio frequency (RF) signals may be used to carry data (e.g., content), with the data being embedded into the analog signals in accordance with particular analog or digital modulation schemes. For analog communications, data is transferred using continuously varying analog signals, and for digital communications, the analog signals are used to transfer discrete messages in accordance with a particular digitalization scheme. Thus, handling of digital communications (e.g., in the electronic system 100) may typically require performing, among other things, digital-to-analog conversions on the transmitter-end and analog-to-digital conversions at the receiver-end.

Digital-to-analog conversions and/or analog-to-digital conversions may also be performed in the electronic system 100 during other (non-communicative) operations. For example, during audio/video related operations, audio/video content that is typically formatted in digital form may be processed to generate corresponding analog audio or video signals during output operations, and captured audio and/or video analog signals may be processed, to generate the digital audio/video content. That processing may comprise performing digital-to-analog conversions (e.g., during output operations), and/or analog-to-digital conversions (e.g., during input operations).

Accordingly, the electronic system 100 may incorporate suitable components for providing digital-to-analog conversions and/or analog-to-digital conversions. For example, the electronic system 100 may comprise one or more digital-to-analog converters (DACs) 110. Each DAC 110 may comprise suitable circuitry for performing digital-to-analog conversions. The DACs 110 may be utilized, e.g., during signal processing, such as to allow converting digital data into analog waveforms—e.g., corresponding to and/or being embedded into acoustic signals, radio frequency (RF) signals, etc. The disclosure, however, is not limited to any particular use scenario, and may be utilized in any appropriate setup performing or requiring digital-to-analog conversions.

Various architectures and/or designs may be used for digital-to-analog conversions and/or in implementing corresponding digital-to-analog converters (DACs). Example types of DACs include pulse-width modulation (PWM) DACs, binary-weighted DACs, oversampling or interpolating (e.g., delta-sigma) DACs, R-2R ladder DACs, successive-approximation (or cyclic) DACs, thermometer-coded DACs, etc. In each of these DAC architectures and/or designs, digital-to-analog conversions may be achieved by adjusting a particular parameter (e.g., voltage, current, etc.) based on input binary data, in a particular manner. For example, with current-steering DACs, the digital-to-analog conversion may be performed based on steering of current from various sources, with the steering being controlled or adjusted based on the input digital data (sequence of bits).

In some instances, DACs may incorporate combined or hybrid implementation or architecture, whereby parts of the DAC may be configured for handling particular portions of the digital input code to be converted. For example, the DAC 110 may be implemented using segmented architecture, comprising a segment for handling the most significant bits (MSBs) of the digital input (MSB segment), and one or more other segments for handling the remaining part(s) of the digital input (e.g., the least significant bits (LSBs) of the digital input). In a particular example implementation, the MSB segment may comprise unit-weighted elements and may be thermometer-coded. The number of bits handled in the MSB segment may vary. The one or more other segments may be implemented using less costly techniques or architectures (e.g., based on binary-coded toggling).

In some instances, DACs may use certain various techniques or features for handling particular conditions. For example, in some instances, DACs may incorporate use of dynamic element matching (DEM), which may be used to attempt to address mismatch errors that may result from, for example, differences between actual values and ideal/expected values. Such mismatch errors, if not addressed, may otherwise cause conversion errors. For example, the mismatch errors may be addressed in the DAC by using dynamic element matching to enable scrambling of these mismatch errors, to prevent them from forming spurious tones or distortions at the DAC output.

Various issues may arise with DACs and operations thereof, which may need to be accounted for and/or addressed to optimize performance or operation of the DACs. Some of these issues may be general (e.g., affecting and/or existing in all DACs), while other issues may be specific (e.g., limited to particular type(s) of DAC, to particular technique(s) for digital-to-analog conversion, to particular operation condition(s), etc.). For example, in some instances, the DACs may be configured such that they may not be operating at full scale—e.g., the signal may be backed off from full scale. In this regard, "full scale" represents the maximum signal amplitude a system can present (or handle), and as such signals may be described as "backed off" or operating at "backoff" condition when not reaching full scale. Thus, a high backoff means very small signal amplitude, comparatively smaller than full scale; a low backoff means signal amplitude close to full scale; and no backoff means a full scale signal—that is having amplitude at full scale. Such backing off may cause or contribute to various issues or potential errors, such as power burst related issues. In this regard, backoff conditions may have varying effects on DACs based on the architectures used therein and/or any particular incorporated function. This may be the case, for example, where dynamic element matching (DEM) is used in the DACs. This may be addressed in various ways. For example, operations of the DACs may be controlled in adaptive manner to account for backoff conditions. An example DAC that uses DEM, but in adaptive manner to account for backing off, is described in more detail with respect to FIG. 2. Another example implementation of a DAC that uses DEM with calibration, particularly for handling backoff conditions, is described in FIG. 4.

Further, in some instances DACs implemented in accordance with the present disclosure may incorporate additional features and/or functions for further enhancing operations of the DACs. For example, in some instances these DACs may support use of digital offsets as described in U.S. patent application Ser. No. 15/130,636, filed on Apr. 15, 2017 and entitled "DIGITAL-TO-ANALOG CONVERTER (DAC) WITH DIGITAL OFFSETS"; and/or optimized constant switching techniques as described in U.S. patent application Ser. No. 15/130,602, filed on Apr. 15, 2017 and entitled "DIGITAL-TO-ANALOG CONVERTER (DAC) WITH PARTIAL CONSTANT SWITCHING".

Figure 2:
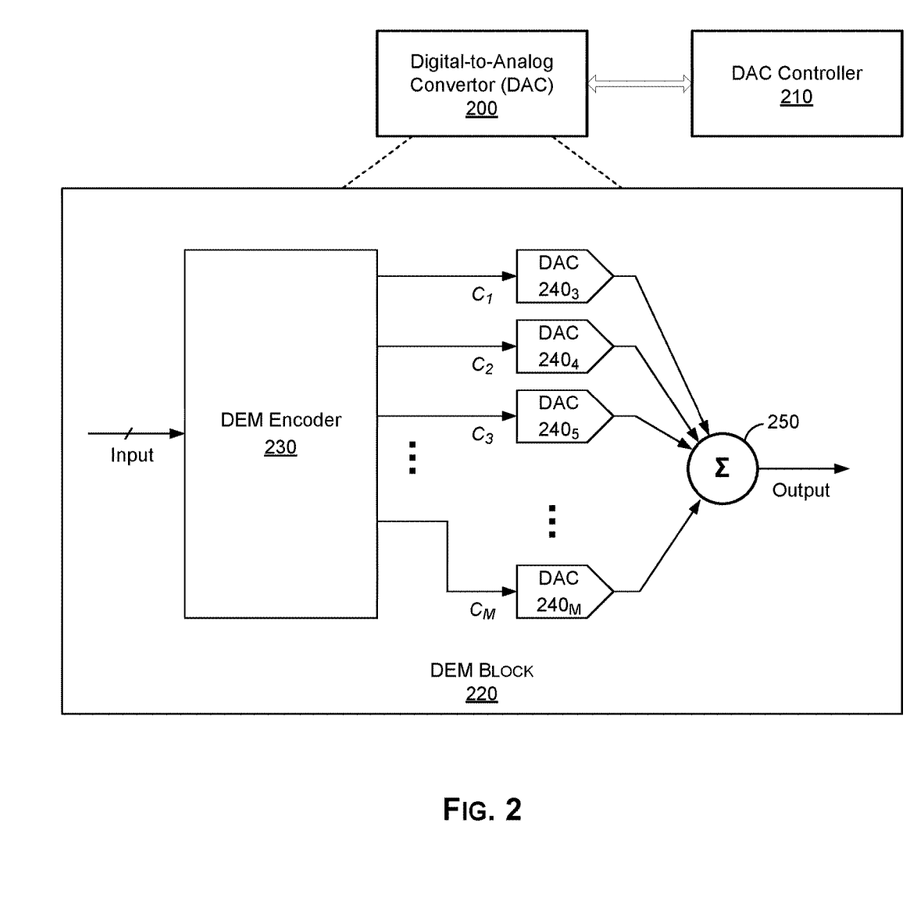
FIG. 2 illustrates an example digital-to-analog convertor (DAC) that supports dynamic element matching (DEM).

FIG. 2 illustrates an example digital-to-analog convertor (DAC) that supports dynamic element matching (DEM). Shown in FIG. 2 is digital-to-analog convertor (DAC) 200. Also shown in FIG. 2 is a DAC controller 210.

The DAC 200 may comprise suitable circuitry for performing digital-to-analog conversions. The DAC 200 may correspond to, for example, the DAC 110, substantially as described with respect to FIG. 1. The DAC 200 may be utilized, for example, during signal processing, such as to allow converting digital data into analog waveforms. The disclosure, however, is not limited to any particular use scenario, and may be utilized in any appropriate setup performing or requiring digital-to-analog conversions.

As noted above, various designs, architectures, and/or implementations may be used in digital-to-analog conversions and/or in implementing digital-to-analog convertors (DACs). This may include the use of dynamic element matching (DEM). In this regard, dynamic element matching (DEM) may be used in DACs, incorporating a plurality of DAC elements (each performing digital-to-analog conversion, e.g., corresponding to a single bit in a multi-bit digital input), as an effective technique for improving linearity and spurious-free dynamic range (SFDR) in DACs. Use of DEM may enable scrambling mismatch errors. In this regard, "mismatch errors" may arise from and/or be caused by mismatches between the DAC elements, which may include static mismatches, corresponding to mismatches or variations in the elements themselves (e.g., physical differences between the elements, due to variations introduced during manufacturing of the elements, for example), and/or dynamic mismatches, corresponding to mismatches during operations of the elements, such as due to conditions that uniquely affect the different DAC elements (e.g., the signals/bits handled thereby). Use of DEM allows scrambling these errors into the overall output of the DAC, such that the errors (or effects thereof) may appear as white or shaped noise, so that these errors would not contribute to nonlinear distortions in the DAC output.

For example, in the example implementation depicted in FIG. 2, the DAC 200 may comprise one or more of DEM block(s) 220, with each DEM block 220 comprising suitable circuitry for performing dynamic element matching. The DEM block 220 may comprise, for example, a plurality of equally-weighted DAC elements $240_1$-$240_M$ and an adder 250, for combining the outputs of the DAC elements $240_1$-$240_M$.

The DEM block 220 may also comprise an 'encoder' portion, shown as DEM encoder 230. The DEM encoder 230 may comprise suitable circuitry for controlling turning on/off of the DAC elements $240_1$-$240_M$, such as based on the input(s) to the DEM block 220. In this regard, the input to the DEM block 220 may be the digital code (or portion thereof) being converted to corresponding analog output via the DAC 200.

Various techniques and/or designs may be used in implementing the encoder portion of the DEM block 220, and/or functions thereof. For example, the DEM encoder 230 may be implementing based on switching approach, whereby one or more switching elements may be used within the DEM blocks 220 that are used, collectively, to control the switching of the DAC elements $240_1$-$240_M$. Each switching element may be configured to, for example, perform a particular switching sequence, based on inputs to the switching elements. The number and/or arrangement of switching elements may be based on the particular switching scheme used and/or applied by the DEM block 220.

The DAC controller 210 may comprise suitable circuitry for controlling and/or supporting operations of the DAC 200. For example, the DAC controller 210 may be operable to provide storage, processing, etc., during operations of the DAC 200, so as to support adaptive use thereof. The DAC controller 210 may be a separate component, external to the DAC 200, as shown in the example implementation depicted in FIG. 2 for example. The disclosure is not so limited, however, and the DAC controller 210 may be incorporated into the DAC 200 (or even the DEM block 220 itself), and/or at least some of the functions described with respect to the DAC controller 210 may be performed by existing circuitry in the DAC 200 (or by the DEM block 220 itself).

As noted above, dynamic element matching (DEM) may be used to improve performance in DACs (particularly in DACs incorporating a plurality of DAC elements), such as to enable improving linearity and spurious-free dynamic range (SFDR) in the DACs. In this regard, DEM may be used to randomize spurs, whereby spur energy may be spread over a wider frequency range improving SFDR performance. There may be, however, certain issues or concerns associated with DEM and the use thereof in DACs. For example, in some instances DACs employing DEM may be used to apply digital-to-analog conversions of input signals that may not be at full scale, including scenarios in which the input signals may dynamically change between full scale and high backoff conditions. The higher the backoff the more use of DEM may become of concern. In this regard, while DEM may still be useful at lower backoff conditions—that is, the DEM may still provide at lower backoff conditions all the performance advantages of full scale conditions, it may become a concern at higher backoff conditions as it may actually become a detriment to performance with lower input signal swings. This may be because there is switching activity in the DAC due to DEM irrespective of signal condition (e.g., full scale vs. backed off, low backoff vs. high backoff, etc.). Thus, even at very high backoff conditions, DEM causes DAC cells to switch every cycle. Such switching may be cause for additional spurs, however. In this regard, at high backoff conditions, because the number of switching elements is less, the signal may be less vulnerable to mismatch related impairments, such as static and dynamic mismatch errors, but may be more vulnerable to any additional spurs created by the DEM switching circuitry.

Accordingly, in various implementations in accordance with the present disclosure, dynamic element matching performed in DACs (e.g., in the DAC 200, such as in the DEM block 220) may be configured and/or implemented so that it may operate in an adaptive manner, particularly based on characteristics of the DACs and the signals being processed (converted) via the DACs. The DEM function(s) in DACs may be controlled, for example, such as based on signal conditions. For example, the DEM function as a whole, and/or individual DEM elements (e.g., each of the DEM blocks 220), may be turned on/off based on signal conditions (e.g., input signal backoff from full scale).

In an example implementation, signal power may be measured (e.g., in the digital-side), and used in adaptively controlling the DEM function(s)/element(s). For example, received signal strength indicator (RSSI) may be used to measure the signal power in the digital-side. The signal power may be used as measure of the backing off of the signal. Thus, when a signal power exceeds (or falls below) a particular threshold (e.g., 32 dB backoff), DEM may be adjusted accordingly (e.g., turned on or off). Thus, DEM may be applied in adaptive manner, being turned off for higher backoff conditions while still allowing for its use (and thus benefits from DEM use) at lower backoff conditions.

In an example implementation, dedicated control logic may be used for providing the necessary power-driven adjustments compared to traditional DEM operations. For example, DAC controller 210 may be used to store information relating to the adaptive DEM schemes (e.g., backoff thresholds), to process pertinent information (e.g., measured signal power), and/or to provide any adjustments (e.g., via control signals) and/or information required for effectuating the changes in accordance with the particular adaptive DEM scheme(s) being applied.

Figure 3:
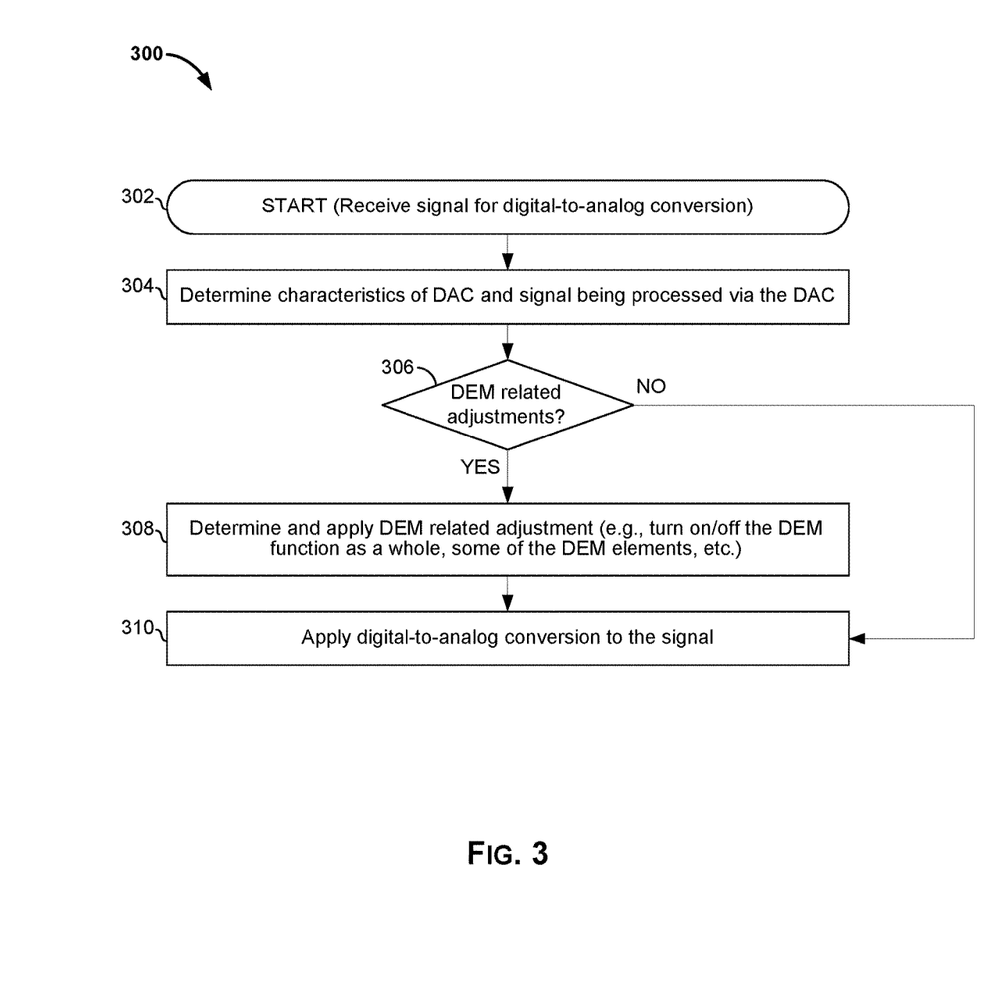
FIG. 3 illustrates a flowchart of an example process for adaptively controlling a digital-to-analog converter (DAC) with dynamic element matching (DEM) based on signal power.

FIG. 3 illustrates a flowchart of an example process for adaptively controlling a digital-to-analog converter (DAC) with dynamic element matching (DEM) based on signal power. Shown in FIG. 3 is flow chart 300, comprising a plurality of example steps (represented as blocks 302-310), which may be performed in a suitable system (e.g., the DAC 200 and/or the DAC controller 210 of FIG. 2) to control DEM based on signal power.

In start step 302, a signal may be received for digital-to-analog conversion.

In step 304, characteristics of the digital-to-analog convertor (DAC) and the received signal intended for processing via the DAC may be determined. For example, the DAC may be assessed to determine pertinent information (e.g., use of DEM, full scale profile, etc.), and signal power may be determined (e.g., measured, being used as indicative of signal backing off).

In step 306, it may be determined whether or not DEM based adjustments are needed. This may be based on the information obtained in the previous step. For example, the measured signal power may be used to assess the amount of backing off, which may be then compared with a pre-set threshold to determine when/if DEM adjustments are needed. If DEM based adjustments are needed, the process may proceed to step 308; otherwise, the process may jump directly to step 310.

In step 308, DEM related adjustments may be determined and applied. The DEM adjustments may comprise, for example, turning on/off the DEM function as a whole, some of the DEM elements, etc.

In step 310, digital-to-analog conversion may be applied to the signal.

Figure 4:
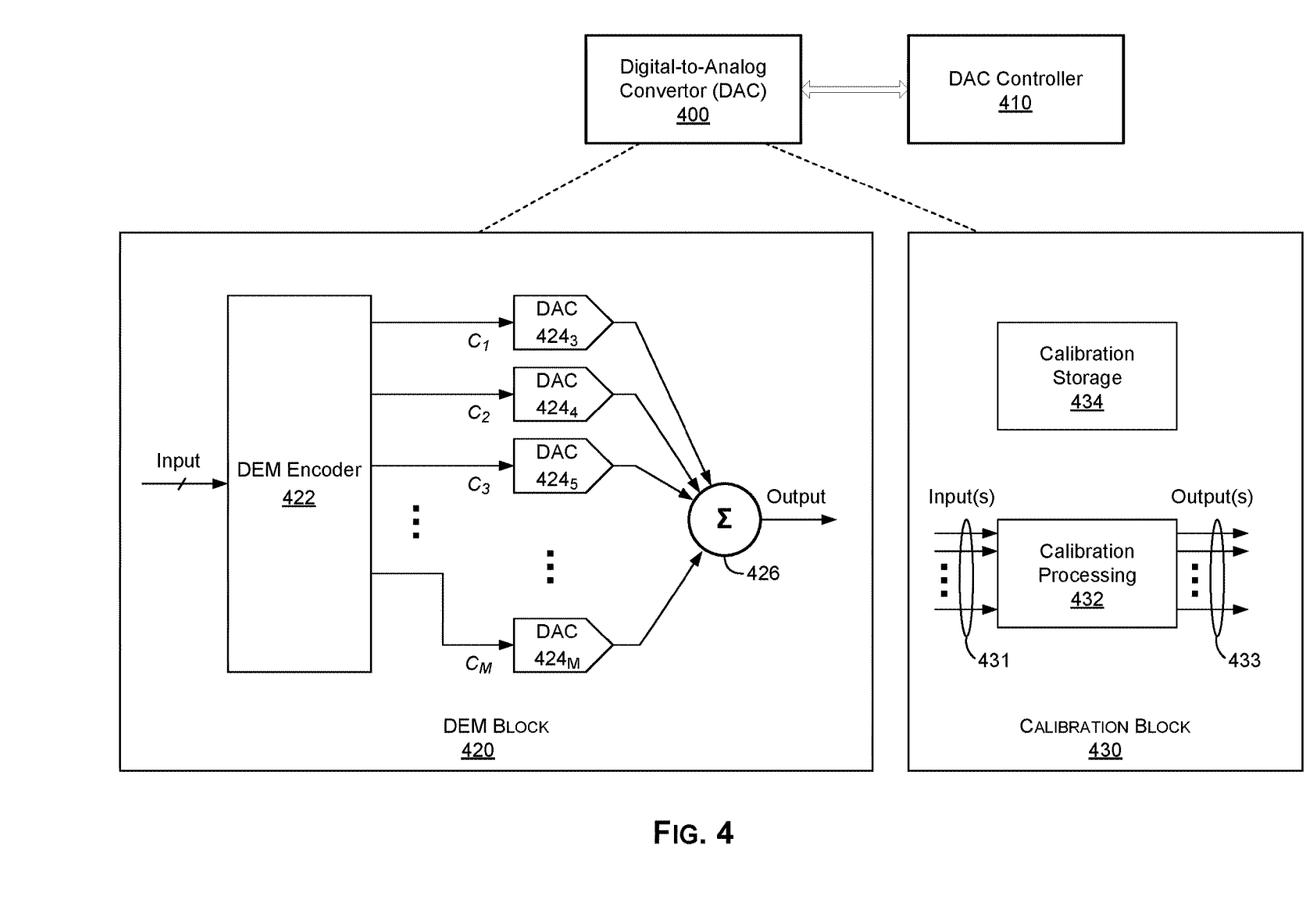
FIG. 4 illustrates an example digital-to-analog convertor (DAC) that supports dynamic element matching (DEM) and calibration.

FIG. 4 illustrates an example digital-to-analog convertor (DAC) that supports dynamic element matching (DEM) and calibration. Shown in FIG. 4 is digital-to-analog convertor (DAC) 400. Also shown in FIG. 4 is a DAC controller 410.

The DAC 400 may comprise suitable circuitry for performing digital-to-analog conversions. The DAC 400 may correspond to, for example, the DAC 110, substantially as described with respect to FIG. 1. As with the DAC 200 of FIG. 2, the DAC 400 may also be implemented as dynamic element matching (DEM) based DAC. In this regard, as noted above, dynamic element matching (DEM) may be used to improve performance in DACs (particularly in DACs incorporating a plurality of DAC elements), such as to enable improving linearity and spurious-free dynamic range (SFDR) in The DACs. In this regard, DEM may be used to randomize spurs, whereby spur energy may be spread over wider frequency range, thus improving SFDR performance.

The DAC 400 may also be configured to support other techniques for enhancing performance. For example, another technique that may be used in enhancing DAC's performance is calibration, which may be used to correct certain errors or issues that may occur during operation of DACs, such as mismatch errors, and/or to reduce the adverse effects resulting therefrom, such as spurs. In this regard, "calibration" as used herein may comprise calibrating (or otherwise adaptively adjusting) certain parameters and/or functions of the DAC (and/or component thereof, such as voltages (e.g., reference, supply, or ground voltages), current sources, etc.

Calibration may be performed in different ways and/or use different designs, architectures, and/or implementations. For example, calibration may be done as "background" calibration or as "foreground" calibration. In this regard, with foreground calibration, DACs may be calibrated only when not being used in (normal) conversion operations. Rather, the DAC is offline while it is being calibrated. For example, when using foreground calibration, the DAC 400 may be configured to switch between "normal" mode and "calibration" mode. Only when it is in "calibration" mode, is calibration performed on the DAC 400 (but normal operations may not possible during such calibration mode). To perform foreground calibration, the DAC is taken offline for a period of time, and the DAC may then be put into particular a pre-determined condition (e.g., by injunction particular reference signal(s), force particular circuit(s) into a known state, etc.). The output is then detected and compared against an "expected" profile for the pre-determined condition, in order to determine correction needed (type and/or amount). The correction (calibration) may then be performed before returning to normal operations.

With background calibration, DACs may be calibrated while being used for (normal) conversion operations. Thus, with background calibration, the DAC 400 may be calibrated dynamically—e.g., during operations of the DAC 400. Thus, to support background calibration, DACs (or calibration elements thereof) may comprise suitable circuitry for allowing the DACs to be in use (i.e., converting digital inputs to analog waveforms) while being calibrated.

In the example implementation depicted in FIG. 4, the DAC 400 may comprise one or more of DEM blocks 420 and one or more calibration blocks 430. Each DEM block 420 may be substantially similar to and may operate in substantially similar manner as the DEM block 220, as described with respect to FIG. 2. In this regard, the DEM block 420 may comprise a plurality of equally-weighted DAC elements $424_1$-$424_M$, an adder 426, and an 'encoder' portion, shown as DEM encoder 422, which may be substantially similar to and may operate in substantially similar manner as the plurality of DAC elements $240_1$-$240_M$, the adder 250, and the DEM encoder 230, as described with respect to FIG. 2.

The DAC controller 410 may be substantially similar to and may operate in substantially similar manner as the DAC controller 210 of FIG. 2. In this regard, the DAC controller 410 may comprise suitable circuitry for controlling and/or supporting operations of the DAC 400. For example, the DAC controller 410 may be operable to provide storage, processing, etc., during operations of the DAC 400, so as to support adaptive use thereof. The DAC controller 410 may be a separate component, external to the DAC 400, as shown in the example implementation depicted in FIG. 2, for example. The disclosure is not so limited, however, and the DAC controller 410 may be incorporated into the DAC 400 (or even the DEM block 420 itself), and/or at least some of the functions described with respect to the DAC controller 410 may be performed by existing circuitry in the DAC 400 (or by the DEM block 420 itself).

Each calibration block 430 may comprise suitable circuitry for performing and/or supporting calibration (e.g., foreground and/or background calibration) in the DAC 400. In the example implementation shown in FIG. 2, each calibration block 430 may comprise a calibration processing block 232 and a calibration storage block 234. The calibration process block 232 may comprise suitable circuitry for processing one or more inputs 431 (e.g., input to the DAC 400, intermediate signal(s) generated within the DAC 400, output of the DAC 400, control/clocking signals used in the DAC 400, etc.) to determine necessary calibration adjustments, which may be conveyed and/or effectuated via one or more calibration outputs 433. The calibration outputs 433 may comprise control signals used in controlling calibration operations (e.g., calibration clock signals) and/or to convey calibration-related adjustments to pertinent components of the DAC 400. The calibration storage block 234 may comprise suitable circuitry for storing data pertaining to calibration operations. For example, the calibration storage block 234 may store correction parameters that be used when adjusting particular components (or functions thereof) in the DAC 400.

In some instances, certain issues or concerns associated with DEM and/or calibration, and the use thereof in DACs, may arise. For example, DEM and calibration may typically be performed on the MSBs. In some instances, however, DACs employing DEM may be used to apply digital-to-analog conversions of input signals that may not be at full scale. Performing DEM and/or calibration on the MSBs may not be beneficial in such signal backed off situations. For example, the higher the backoff the more use of DEM may become of concern. In this regard, while DEM may still be useful at lower backoff conditions, it can become a concern at higher backoff conditions. This may be because there is switching activity in the DAC due to DEM irrespective of signal condition (e.g., full scale vs. backed off, low backoff vs. high backoff, etc.). Thus, even at very high backoff conditions, DEM causes DAC cells to switch every cycle. Such switching may be cause for additional spurs, however. Similarly, calibrating MSBs (or MSB segments) may not improve performance as the MSB may not even switch after particular backoff values (e.g., backoff of 32 dB). Thus, the desired improved performance with respect to errors (and reduction of spurs) may not be materialized.

Accordingly, in various implementations in accordance with the present disclosure, DEM and calibration may not be performed on the MSBs, but rather at bits (or segments corresponding thereto) that are anticipated to switch under backoff conditions. For example, the DACs may apply DEM and/or calibration only to particular switching element corresponding to certain bits in the input, such as the upper LSBs (ULSBs), which may be the bits determined to switch during backoff conditions. In this regard, the LSBs may include various distinct subsets, each comprising one or more bits, designated based on their position with the overall input code (in relation to the MSBs). The LSBs may be divided into, for example, ULSBs, which comprise one or more LSBs that follow directly after the MSBs; followed by the middle LSBs (MLSBs), which comprise one or more LSBs that follow the ULSBs; and the lower LSBs (LLSBs), which comprise one or more LSBs that follow the MLSBs. Further, the DACs may incorporate segments corresponding to these different sets of bits. For example, a 13-bit DAC may be implemented with a 4/3/3/3 segmentation—that is, e.g., first segment for handling the 4 most significant bits (MSB); a second segment for handling the 3 upper least significant bits (ULSBs) that follow the 4 MSBs; a third segment for handling the 3 middle least significant bits (MLSBs) that follow the 3 ULSBs; and a fourth segment for handling the 3 lower least significant bits (LLSBs) that follow the 3 MLSBs.

Various approaches may be used in this regard, including static and/or adaptive ones. For example, the DACs may be implemented such that DEM and/or calibration may be only incorporated into and/or applied to the ULSBs alone. Alternatively, the DACs may be adaptively (re)configured to apply one or both of DEM and calibration to different bit segments, to allowing applying it to the proper segments based on a determination of whether (or not) the DAC is in full scale mode, and/or the amount of backing off (when the DAC's input signal is backed off). In an example implementation, static/timing calibration may be performed on the ULSB bits. Example implementations are shown in FIGS. 5 and 6.

Figure 5:
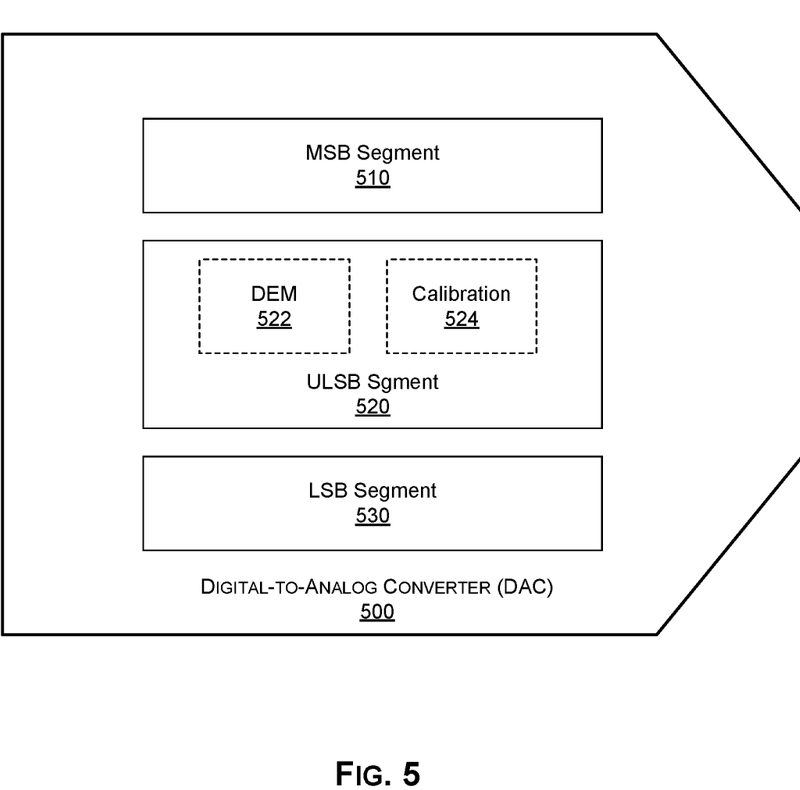
FIG. 5 illustrates an example digital-to-analog converter (DAC) that applies dynamic element matching (DEM) and calibration only to the upper LSBs (ULSBs).

FIG. 5 illustrates an example digital-to-analog converter (DAC) that applies dynamic element matching (DEM) and calibration only to the upper LSBs (ULSBs). Shown in FIG. 5 is DAC 500.

The DAC 500 may be similar to the DAC 400 of FIG. 4, for example. In this regard, the DAC 500 may comprise suitable circuitry for performing digital-to-analog conversions, and for supporting dynamic element matching (DEM) and calibration. In particular, the DAC 500 may be implemented to only perform DEM and calibration on upper LSBs (ULSBs). For example, as depicted in FIG. 5, the DAC 500 may comprise three different segments 510, 520, and 530 for handling the MSBs, the ULSBs, and the LSBs of input (digital) codes converted via the DAC 500. In this regard, each of the segments 510, 520, and 530 may comprise suitable circuitry for performing digital-to-analog conversions respectively to the input MSBs, the ULSBs, and the LSBs. The outputs of these segments may then be combined to provide the overall output of the DAC 500. In this example implementation, only the ULSB segment 520 may be implemented to perform DEM and calibration. In this regard, the ULSB segment 520 may comprise a DEM block 540 and a calibration block 550 (similar to the DEM block 420 and the calibration block 430 of FIG. 4). Accordingly, DEM and calibration may be limited to the ULSBs.

Figure 6:
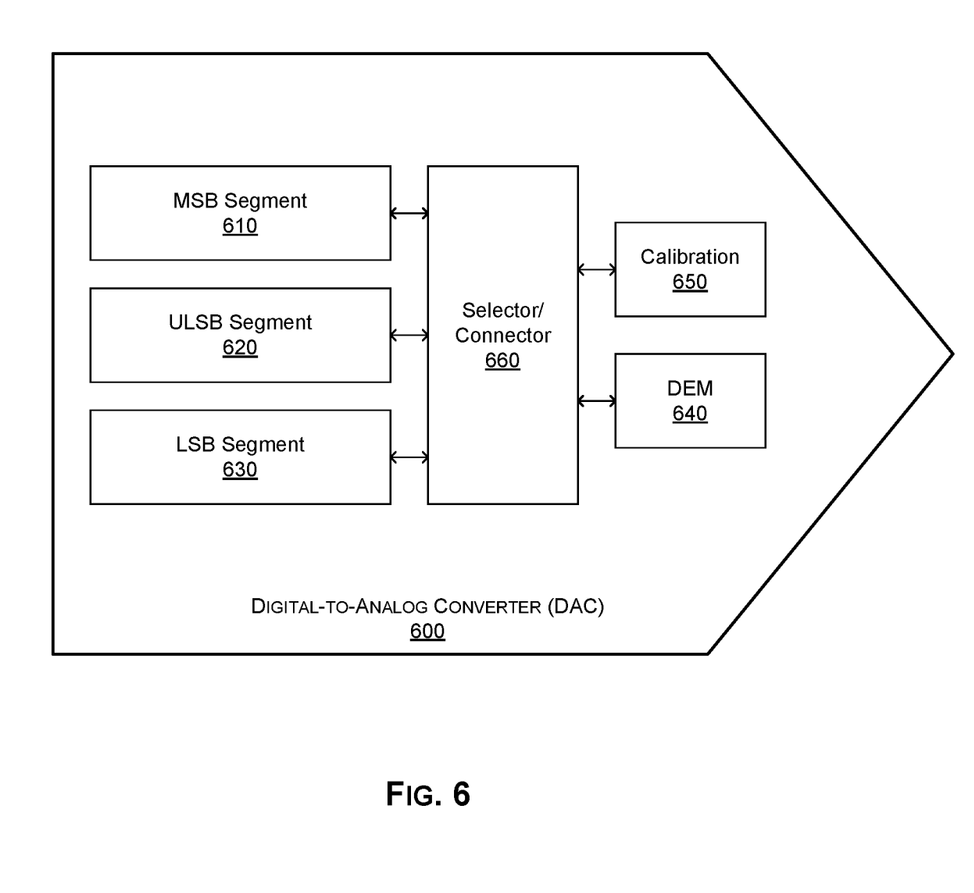
FIG. 6 illustrates an example digital-to-analog converter (DAC) that adaptively applies dynamic element matching (DEM) and calibration.

FIG. 6 illustrates an example digital-to-analog converter (DAC) that adaptively applies dynamic element matching (DEM) and calibration.

The DAC 600 may be similar to the DAC 500 of FIG. 5, for example. In this regard, the DAC 600 may comprise suitable circuitry for performing digital-to-analog conversions, and for supporting dynamic element matching (DEM) and calibration. In particular, the DAC 600 may be implemented such that it may be adaptively configured to perform DEM and calibration on various portions of the digital inputs, including on upper LSBs (ULSBs). For example, as depicted in FIG. 6, the DAC 600 may comprise three different segments 610, 620, and 630 for handling the MSBs, the ULSBs, and the LSBs of input (digital) codes converted via the DAC 600. In this regard, each of the segments 610, 620, and 630 may comprise suitable circuitry for performing digital-to-analog conversions to respectively the MSBs, the ULSBs, and the LSBs of the digital input code. The overall output of the DAC 600 may be generated based on the outputs of these segments (e.g., by combining these outputs).

The DAC 600 may also comprise a DEM block 640 and a calibration block 650 (similar to the DEM block 520 and the calibration block 530 of FIG. 5), which may be operable to perform DEM and calibration, respectively. Further, the DAC 600 may comprise a selector/connector block 660, which may comprise suitable circuitry for selecting one or more of the segments 610, 620, and 630 for incorporation of DEM and/or calibration function, and/or suitable circuitry for facilitating incorporating these functions. For example, the selection of the particular segments may be based on pre-defined parameters or criteria, user input, and/or parameters associated with the input signals being converted (e.g., being full scale or backed off, and the amount of backing off if backed off). The functions may be incorporated by connecting the particular selected one or more of the segments 610, 620, and 630 with the DEM block 640 and/or the calibration block 650, such as using suitable circuitry for connecting the respective circuits, and/or using suitable circuitry for routing signals into and/or from (and/or between) these circuits.

Thus, the DAC 600 may be operable to adaptively incorporate DEM and/or calibration during handling of one or more of the MSBs, ULSBs, and LSBs. Accordingly, the DEM and/or calibration may be only be performed when deemed necessary—e.g., on the segment where switching is expected to take place. For example, during full scale mode, the DEM block 640 and/or the calibration block 650 may be connected to the MSB segment 610 (thus incorporating DEM and calibration only to handling of MSBs). In backoff conditions, however, the selector/connector block 660 may be configured such that the DEM block 640 and/or the calibration block 650 may be connected to the ULSB segment 620 (thus incorporating DEM and calibration only to handling of ULSBs).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
a digital-to-analog converter (DAC) that is operable to apply digital-to-analog conversions, the DAC comprising:
a plurality of switching elements with each switching element configured to handle particular bit an input to the DAC; and
one or more control circuits operable to apply:
dynamic element matching; and
calibration, to one or more parameters and/or functions of the DAC, the calibration comprises detecting and correcting one or more types of errors that occur during operation of the DAC and/or reducing effects resulting from the one or more types of errors;
wherein the one or more control circuits are operable to apply the dynamic element matching and/or the calibration to only a subset of the plurality of switching elements.

2. The system of claim 1, wherein:
the DAC is operable to switch between a normal mode and a calibration mode; and
the one or more control circuits are operable to apply the calibration only during the calibration mode.

3. The system of claim 1, wherein the one or more control circuits are operable to apply the calibration during active operation of the DAC.

4. The system of claim 1, wherein:
the DAC comprises a plurality of segments, with each segment comprising one or more of the switching elements; and
the one or more control circuits are operable to apply the dynamic element matching and/or the calibration to only one or more of the plurality of segments.

5. The system of claim 4, comprising a selector circuit for facilitating applying the dynamic element matching and/or the calibration to one of the plurality of segments.

6. The system of claim 4, wherein the plurality of segments comprises:
a most significant bits (LSBs) segment;
an upper LSBs (ULSBs) segment; and
a least significant bits (LSBs) segment.

7. The system of claim 6, wherein the one or more control circuits are operable to apply the dynamic element matching and/or the calibration only to the ULSBs segment.

8. The system of claim 1, wherein the one or more types of errors comprise mismatch errors, and the one or more effects resulting from errors comprise spurs.

* * * * *